US010856429B2

(12) United States Patent
Rosedahl et al.

(10) Patent No.: US 10,856,429 B2
(45) Date of Patent: Dec. 1, 2020

(54) MAGNETIC SERVER LATCHING SYSTEM

(71) Applicant: International Business Machines Corporation, Armonk, NY (US)

(72) Inventors: Elias Rosedahl, Zumbrota, MN (US); Marvin M. Misgen, Rochester, MN (US); Jessica R. Eidem, Rochester, MN (US); Phillip Mann, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 45 days.

(21) Appl. No.: 16/144,369

(22) Filed: Sep. 27, 2018

(65) Prior Publication Data

US 2020/0107460 A1    Apr. 2, 2020

(51) Int. Cl.
G06F 1/16      (2006.01)
H05K 5/00     (2006.01)
H05K 7/00     (2006.01)
H05K 5/02     (2006.01)
H05K 7/14     (2006.01)
H05K 7/18     (2006.01)

(52) U.S. Cl.
CPC ......... H05K 5/0221 (2013.01); H05K 7/1401 (2013.01); H05K 7/1487 (2013.01); H05K 7/1489 (2013.01); H05K 7/183 (2013.01)

(58) Field of Classification Search
CPC .. H05K 5/0221; H05K 7/1401; H05K 7/1487; H05K 7/1489; H05K 7/183
USPC .................................................. 361/724–727
See application file for complete search history.

(56) References Cited

U.S. PATENT DOCUMENTS

| 3,837,195 | A | * | 9/1974 | Pelto | E05B 47/0038 |
| | | | | | 70/276 |
| 8,801,054 | B2 | | 8/2014 | Ligtenberg et al. | |
| 8,912,871 | B2 | * | 12/2014 | Lauraire | H01H 3/28 |
| | | | | | 218/120 |
| 9,161,476 | B2 | | 10/2015 | Doglio et al. | |
| 9,380,718 | B2 | | 6/2016 | Wang et al. | |
| 9,668,371 | B1 | * | 5/2017 | Strmiska | E05C 1/006 |
| 9,915,085 | B2 | * | 3/2018 | Strmiska | E05C 1/006 |
| 2008/0296915 | A1 | | 12/2008 | Clark et al. | |

FOREIGN PATENT DOCUMENTS

WO    2013057344 A1    4/2013

OTHER PUBLICATIONS

"Electro-magnetic Locks", dortronics.com, 1997.

* cited by examiner

Primary Examiner — Anthony M Haughton
(74) Attorney, Agent, or Firm — Patterson + Sheridan, LLP

(57) ABSTRACT

A slam latch for mounting and unmounting a server in a rack holding a computing system is disclosed. The slam latch includes a permanent magnet. The slam latch further includes at least one magnetically attractive plate separated by a first distance from the permanent magnet, wherein the permanent magnet has a first force of attraction to the at least one plate. The permanent magnet has a second force of attraction to the at least one plate lower than the first force of attraction when the at least one plate is forceably separated from the permanent magnet by a second distance that is greater than the first distance.

18 Claims, 10 Drawing Sheets

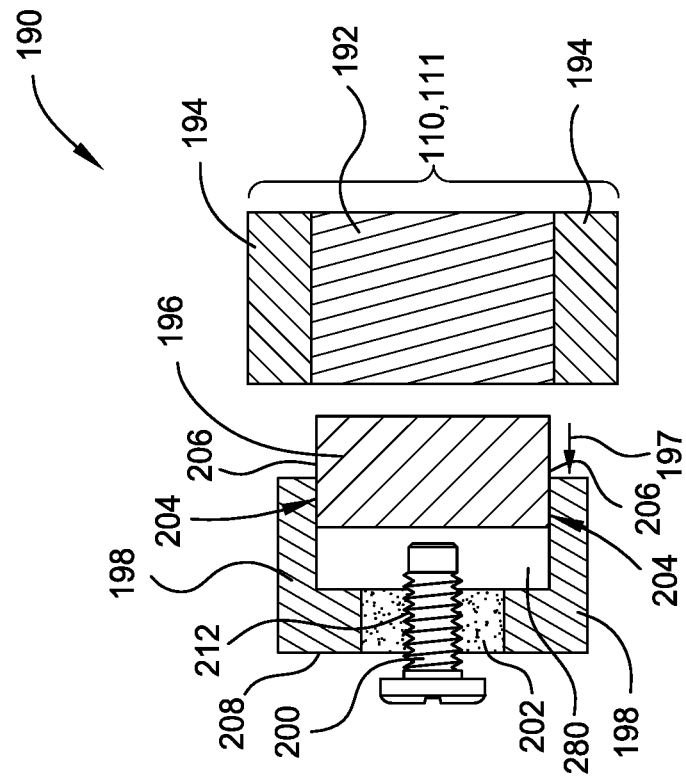
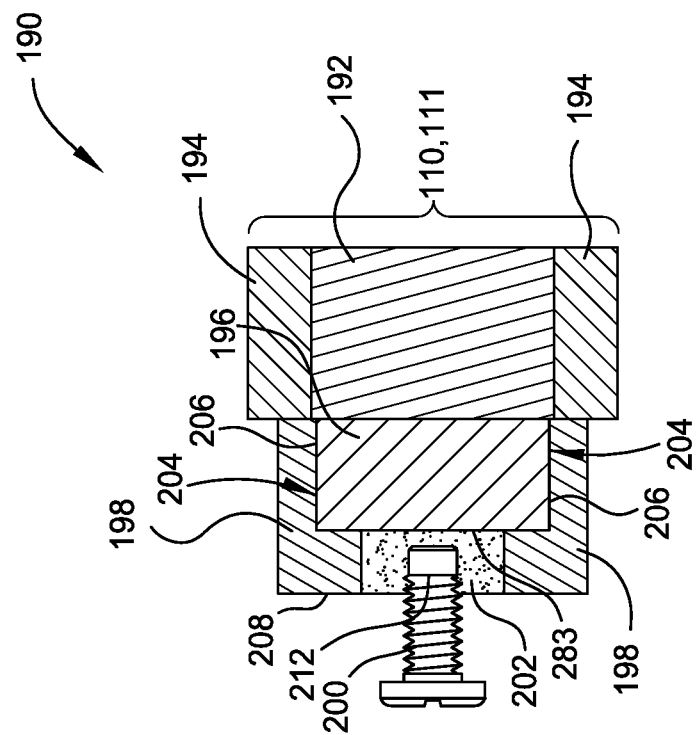
FIG. 7A
FIG. 7B

MAGNETIC SERVER LATCHING SYSTEM

BACKGROUND

The present invention relates to computing systems and more specifically, to a magnetically-operated slam latch for mounting and unmounting a server in a rack holding a computing system.

The term rack server refers to a computing system component designed to be mounted in a rack system. Rack servers may also be called rack-mounted servers. The rack system includes two or more vertical posts providing a frame for mounting rack servers and/or other components of the computing system. The rack system provides a plurality of mounting slots known as bays configured to hold a rack server and/or another component. A rack system may allow multiple servers to be stacked vertically, providing a smaller foot print and simplifying cable connections between the servers.

A simple rack system may include one or more chassis attached to the vertical posts by screws. Some rack systems include rails and/or additional components for mounting hardware components. For example, slide rails allow a chassis to slide in and/or out of the rack without removing screws. As another example, a rack system may allow a user to slide a rack server into existing rails without any additional connectors. In those examples, the rack server is usually retained in the rack by a latch. Operation of the latch allows the rack server to be removed by the user.

A latch is a type of mechanical fastener that joins two (or more) objects or surfaces while allowing for their regular separation. A latch typically engages another piece of hardware on the other mounting surface. As used herein, a slam latch is a type of latch that is activated by the shutting or slamming of a server into an encasing. Servers may employ a slam latch to secure their location to rack rail while maintaining easy accessibility for service. A well designed slam latch prevents motion of the server during shipping or transportation while having as few assembly components as possible. Unfortunately, typical slam latches are unable to solve the server securing issues seen during transportation and vibration. Further, while some conventional slam latches are more robust than others, conventional slam latches typically have complexities that add cost and increase potential for failure.

Accordingly, there is a need in the art for a server slam latch that is robust enough such that servers don't "walk" out of the rack, yet is easy to unlatch for service and easy to manufacture and assemble.

SUMMARY

A slam latch for mounting and unmounting a server in a rack holding a computing system is disclosed. The slam latch includes a permanent magnet. The slam latch further includes at least one magnetically attractive plate separated by a first distance from the permanent magnet. The permanent magnet has a first magnetic force of attraction to an external post. The permanent magnet has a second magnetic force of attraction to the external post lower than the first force of attraction when the at least one plate is forceably separated from the permanent magnet by a second distance that is greater than the first distance.

In one embodiment, the computing system includes a server, a rack with at least one rail, and a slam latch system located in a housing for mounting and unmounting the server in the rack. The slam latch system includes a permanent magnet. The slam latch further includes at least one magnetically attractive plate separated by a first distance from the permanent magnet. The permanent magnet has a first magnetic force of attraction to an external post. The permanent magnet has a second magnetic force of attraction to the external post lower than the first force of attraction when the at least one plate is forceably separated from the permanent magnet by a second distance that is greater than the first distance.

A method for mounting and unmounting a server in a rack holding a computing system is disclosed. The method includes providing a permanent magnet and at least one magnetically attractive plate separated by a first distance from the permanent magnet, wherein the permanent magnet has a first magnetic force of attraction to an external post. The method further includes forceably separating the at least one plate from the permanent magnet by a second distance that is greater than the first distance, wherein the permanent magnet has a second magnetic force of attraction to the external post less than the first force of attraction.

BRIEF DESCRIPTION OF THE SEVERAL VIEWS OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, and may admit to other equally effective embodiments.

FIGS. 7A and 7B show a screw activated magnetically-operated latch mechanism, according to an embodiment.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments of the present disclosure rely on two properties of magnetic materials. The first property is that a sliding friction force between two magnetically attracted objects is significantly less than a straight pull force between the two objects. The second property is that magnetic forces of a magnet are amplified when surrounded by ferromagnetic materials. Embodiments of the present disclosure employ the straight pull force of a magnet to hold a server (which is attached to a rack on rails connected to external posts and cannot move up or down) in the rack. To release the magnet from a secure location between at least one magnetically attracted plate and external posts, and free the server, the magnet is laterally actuated across the at least one magnetically attracted plate of the secure location to lower a force of attraction between the magnet and the external posts.

It is desirable to have variability associated with the holding force of the magnet to facilitate the engagement and securing of the server to EIA rails/posts (strong force), and also to facilitate the disengagement of the server (weak force). Embodiments of the present disclosure have other advantages over conventional mechanical latches. If a magnetic latch disengages unintentionally such as through vibration, the magnetic latch has a tendency to re-latch based on an attractive magnetic force. Conversely, a mechanical latch only re-latches when employing other forces such as gravity. Any acceleration in the wrong direction due to gravity or spring force acting on a mechanical latch may cause a mis-latch.

Figure 1:
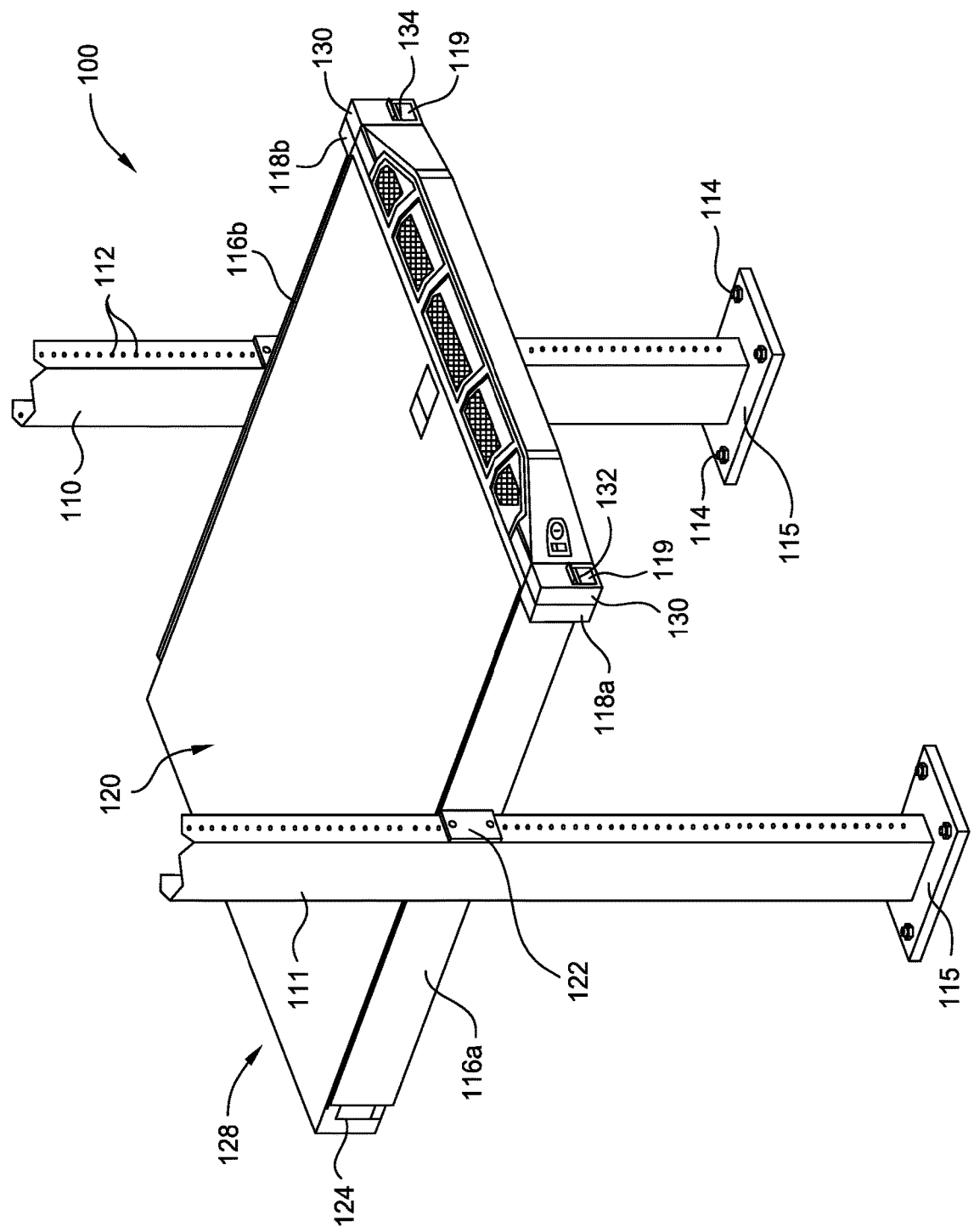
FIG. 1 shows an isometric view of a rack system including a chassis mounted in the rack system, according to the teachings of the present disclosure.

FIG. 1 shows an isometric view of a rack system 100 including a chassis 120 mounted in the rack system 100, according to the teachings of the present disclosure. The rack system 100 may include two or more posts 110, 111 and a server 120. Although FIG. 1 shows a single server 120, the rack system 100 may be part of a computing system including any number of components, including servers, I/O devices, and/or storage devices.

The posts 110, 111 may include any component and/or device providing a structural support for components mounted in a rack system. For example, posts 110, 111 may include vertical members with holes spaced for connecting components to the posts 110, 111. The posts 110, 111 may be made of a magnetically-attracted material or a non-magnetically attracted material or a combination of both. A component (e.g., server 120) may be mounted directly to the posts 110, 111 via holes 112. The component may be mounted by its front panel, or close to its center of gravity. In other examples, such as that shown in FIG. 1, the component may be mounted to rails 116a and 116b which are, in turn, attached to the posts 110, 111 at connector blocks 122 of rails 116 using the holes 112 so that the component is supported along its length. The connector blocks 122 may be made of a magnetic material.

The posts 110, 111 may include one or more features and/or components that attach the posts 110, 111 to the ground and/or floor. For example, the posts 110, 111 may include feet 115. The feet 115 may include flat material defining holes. Bolts 114, pegs, and/or any other vertical member may extend through the feet 115 to provide stability and/or attachment points.

Rails 116 may include any component, device, and/or feature of the rails 116 that provide sliding support for a component of the computing system. For example, the rails 116 may function like drawer slides in traditional cabinets and/or shelving systems. Rails 116 may be used for components that may be frequently removed and/or accessed. The rails 116 may serve to support a component in a position clear of the posts 110, 111 to allow inspection and/or maintenance.

The rails 116a and 116b may include associated tongues 118a and 118b. The tongues 118a and 118b may include any feature, device, and/or component of the rails 116 configured to provide a retention force for components of the computing system. For example, the server 120 may slide into the rails 116a and 116b to be stopped by the posts 110, 111. When the server 120 is fully inserted some component and/or feature of the server chassis (e.g., rack ears 130) may make contact with the tongues 118a, 118b to form a latch and/or other physical detent.

The server 120 may include one or more rack ears 130. The rack ears 130 may provide an attachment point between the server 120 and the rails 116. For example, the rack ears 130 may include a latch 132, 134 that releasably attaches to the tongue 119 when the rack ears 130 and the latch 132, 134 are pushed together. The rack ears 130 may include any device, feature, and/or component of the server 120 and/or a chassis that attaches to the tongues 119. In some embodiments, the rack ears 130 may attach to the tongues 119 as the server 120 slides into the rails 116.

The rack ears 130 may include the latches 132 and 134. The latches 132 and 134 may retain the rack ears 130 and/or the chassis of the server 120 in place with respect to the rack system 100. For example, the latches 132 and 134 may include any mechanical fastener configured to join the rack ears 130 to the rails 116 and to allow regular and/or easy removal of the rack ears 130 from the rails 116, such as a lever, push button, screw fastener, etc. If the rack ears 130 are fixed to the chassis of the server 120, the latches 132 and 134 may also allow the regular and/or easy removal of the server 120 from the rails 116. In some embodiments, a keeper and/or a strike may be present on or in association with the posts 110, 111 to engage with the latches 132 and 134.

Figure 2:
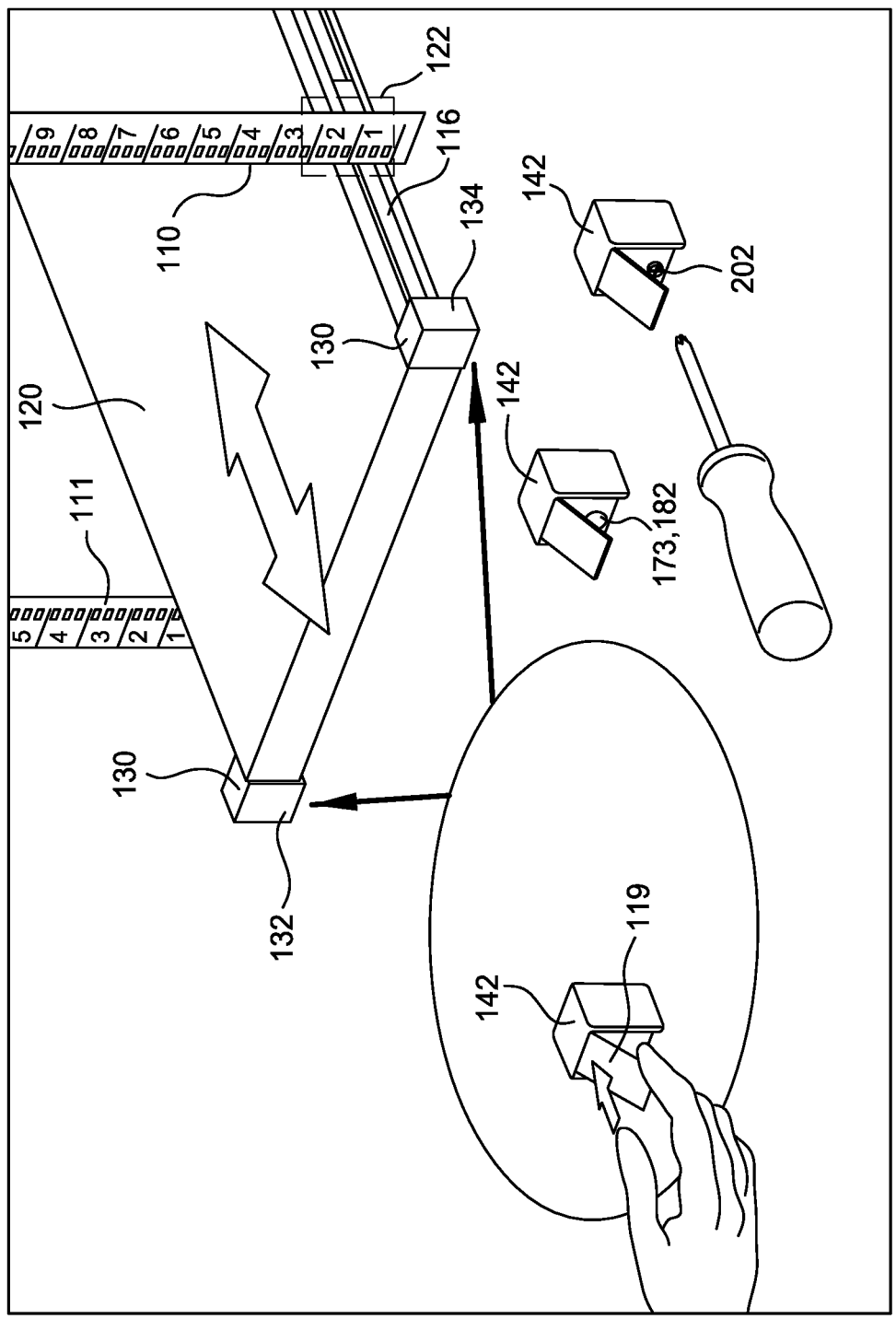
FIG. 2 shows how rack ears may be engaged by slam latches upon the "slamming" of the chassis into rack system.

In one embodiment, the latches 132 and 134 include a slam latch. A slam latch may be engaged by the sliding action of the chassis of the server 120 into the rails 116 to be stopped by the posts 110, 111 and the connector blocks 122. Basically, a slam latch may operate as in a doorknob or a file cabinet drawer, so that it operates by "slamming". For example, when a door is shut, the latch in the doorknob may engage without further action by a user. In embodiments of the present disclosure including a slam latch, rack ears 130 may engage the slam latches 132 and 134 upon the "slamming" of the chassis into rack system 100 as shown in FIG. 2.

Figure 3:
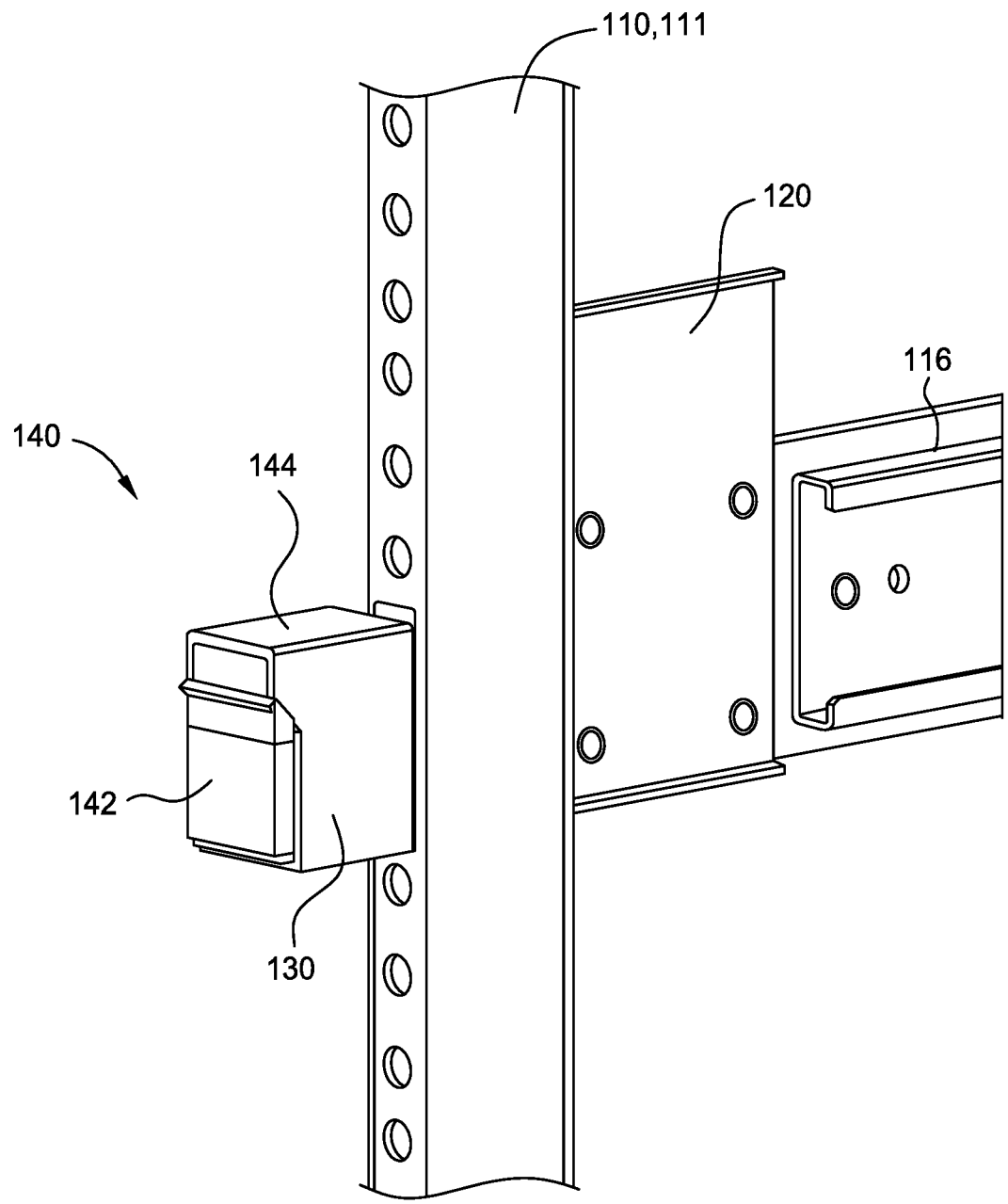
FIG. 3 depicts a magnetically-operated slam latch in a general configuration with a rail, according to an embodiment.

FIG. 3 depicts a magnetically-operated slam latch 140 in a general configuration with a post 110, 111, according to an embodiment. The magnetically-operated slam latch 140 includes an actuating mechanism 142, which may be a lever/tongue 119, a push button 173, 182, or a screw 202. The magnetically-operated slam latch 140 further includes a housing 144 in the rack ears 130 encapsulating the magnetically-operated slam latch 140. The magnetically-operated slam latch 140 utilizes the straight pull force of a permanent magnet to hold the server 120. In one embodiment, the magnetically-operated slam latch 140 employs two properties of magnetic materials. One property is that a sliding friction force between two magnetically attracted objects is significantly less than the straight pull force between those two objects. The other property is that a permanent magnet's magnetic forces are amplified when surrounded by ferromagnetic materials.

The magnetically-operated slam latch 140 includes an internal permanent magnet (not shown) in the housing 144. To release the magnet from its secure location in the slam latch 140 from a closed position (where the actuating mechanism 142 transitions to an "unlatched" or "open" position as shown in FIG. 2 from a "latched" or "closed" position) and free the server 120, the magnet is laterally actuated across a surface. The only force preventing the lateral actuation across the surface may be contact friction, which can be adjusted given material properties, and is considerably less than the straight pull force of the magnet when the magnet is engaged (i.e., when the actuating mechanism 142 in a closed position). It is desirable to have variability associated with the holding force of the magnet to facilitate the engagement and securing of the system to posts 110, 111 (strong force), and also to facilitate the disengagement of the system (weak force). Embodiments of the present disclosure employ "iron guides" or other ferromagnetic plates/guides to increase the strength of a magnet latch when it is used for holding the magnetically-operated slam latch 140 in the closed position, and to reduce the magnetic force of a latch when latch disengagement is desired. Increasing the strength of the magnet holding the magnetically-operated slam latch 140 in its closed position may be provided by focusing the magnetic force.

Various methods and geometries can be employed, as indicated in FIGS. 4A-7B hereinbelow. In the embodiments of FIGS. 4A-7B, the magnetically-operated slam latch 140 includes the permanent magnet and at least one magnetically attractive plate separated by a first distance from the permanent magnet. The permanent magnet has a first magnetic force of attraction to the external post 110, 111. The permanent magnet has a second magnetic force of attraction to the external post 110, 111 lower than the first force of attraction when the at least one plate is forceably separated from the permanent magnet by a second distance that is greater than the first distance.

Figure 4A:
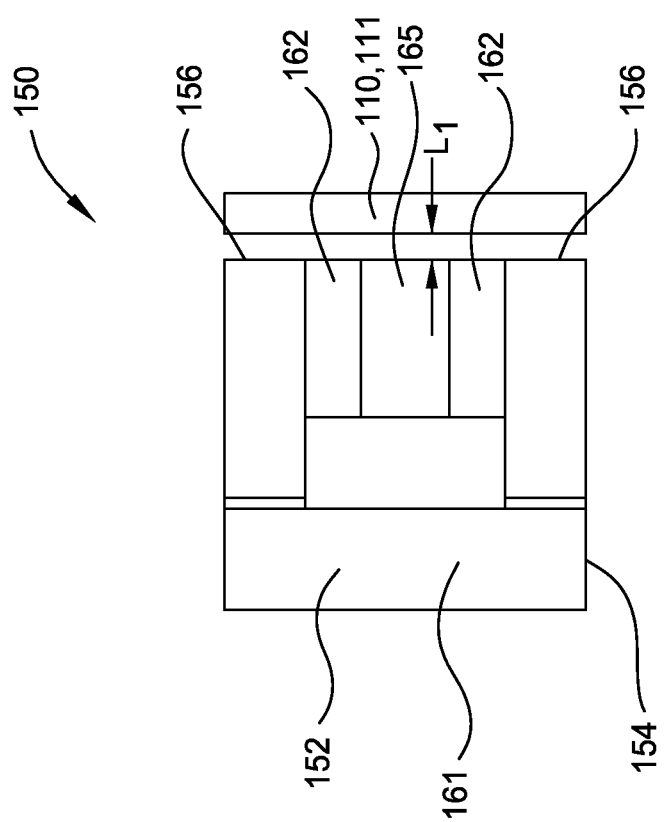
FIG. 4A shows a top-down view of a magnetically-operated latch mechanism within the housing in a closed position or "latch" position, according to an embodiment.
Figure 4B:
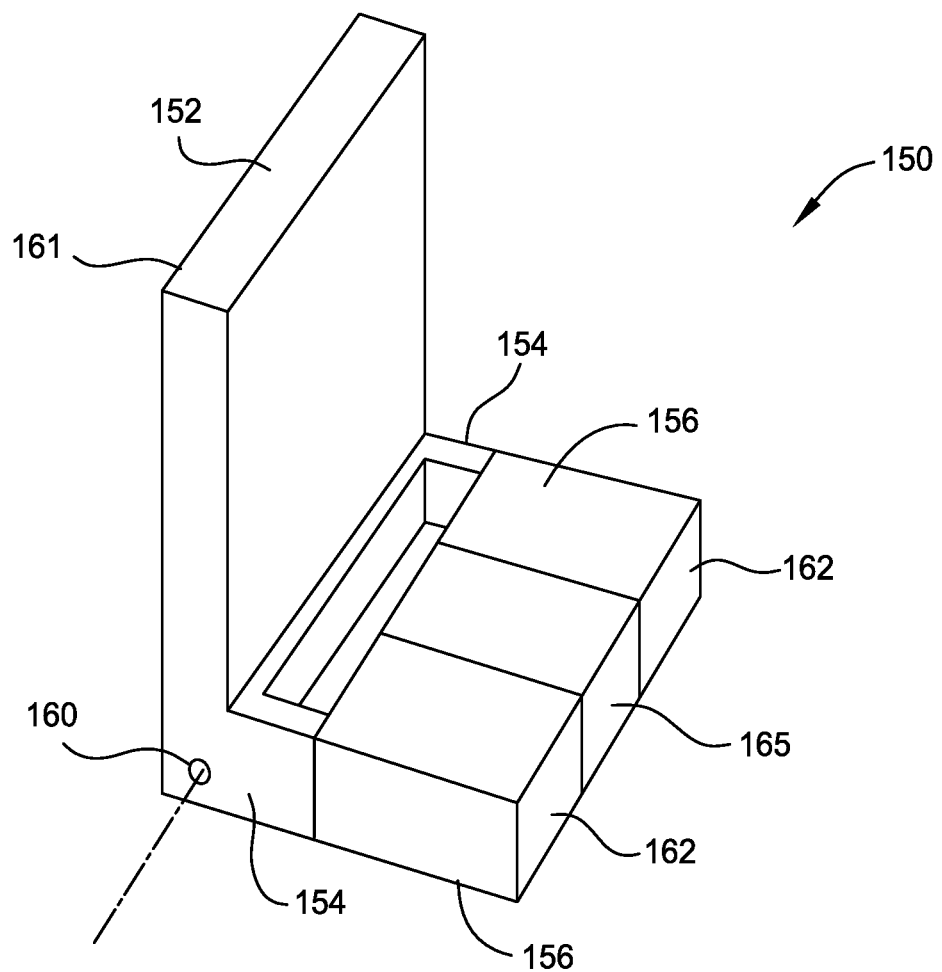
FIG. 4B is a perspective view of the magnetically-operated latch mechanism in the closed position, according to an embodiment.
Figure 4C:
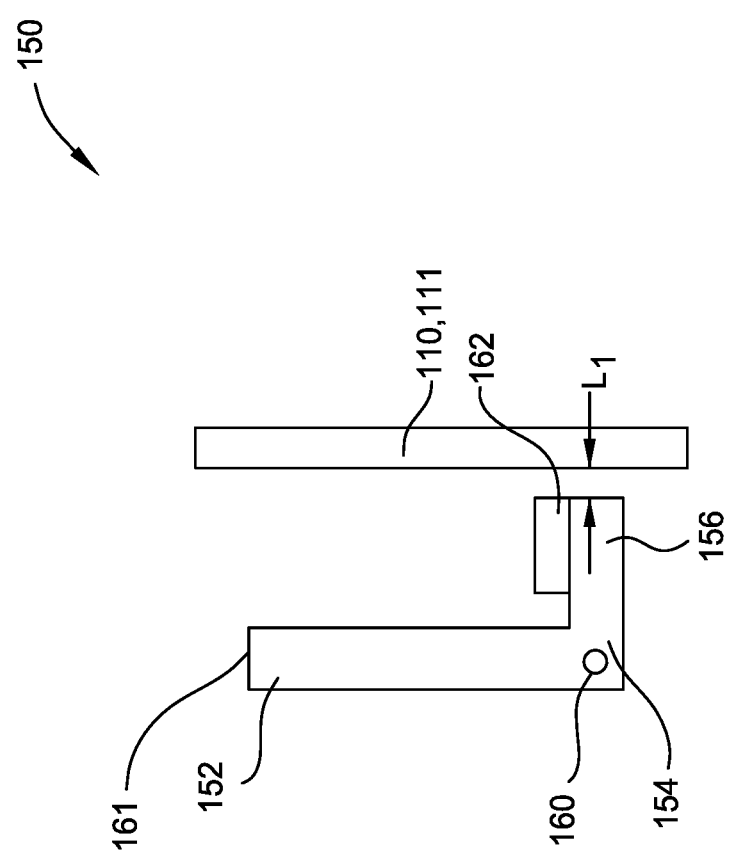
FIG. 4C is a side view of the magnetically-operated latch mechanism in the closed position, according to an embodiment.

FIG. 4A shows a top-down view of a magnetically-operated latch mechanism 150 within the housing 144 (not shown) in a "closed" or "latched" position employing the actuating mechanism 142 in the form of a lever/tongue 119. FIG. 4B is a perspective view of the magnetically-operated latch mechanism 150 in an "closed" or "latched" position. FIG. 4C is a side view of the magnetically-operated latch mechanism 150 in the "closed" or "latched" position. In an example, the generally L-shaped magnetically-operated latch mechanism 150 includes an upper member 152 and a lower member 154. The upper member 152 and the lower member 154 can be made of a non-ferro-magnetic material (e.g. plastic). The lower member 154 includes a pair of extensions 156 extending therefrom on either side of the lower member 154, the sidewalls forming a space 159 therebetween (See FIG. 5A) for slidingly receiving a permanent magnet 165. Corresponding magnetically-attracted plates 162 are affixed to respective ones of the extensions 156 of the lower member 154. The plates 162 may be made, for example, of steel or any other magnetic material. The intersection between the members 152, 154 is threaded with a pin 160 about which the latch mechanism 150 is configured to rotate.

In the "closed" or "latched" position of the magnetically-operated latch mechanism 150 of FIG. 4A, the upper member 152 is in an upright position substantially parallel with an orientation of the post 110, 111. The lower member 154 extends perpendicular to the orientation of the post 110, 111. The extensions 156 and magnetically-attracted plates 162 align with and are in a close proximity to the permanent magnet 165 and the post 110, 111 to produce a maximum amount of magnetic attraction between the permanent magnet 165 and the post 110, 111, thereby retaining the latch mechanism 150 in the "closed" or "latched" position. In the closed or latched position, the permanent magnet 165 is initially separated by a first distance, $L_1$ from the post 110, 111. The pull force required to separate the permanent magnet 165 from the plates 162/post 110, 111 is also at a maximum.

Figure 5A:
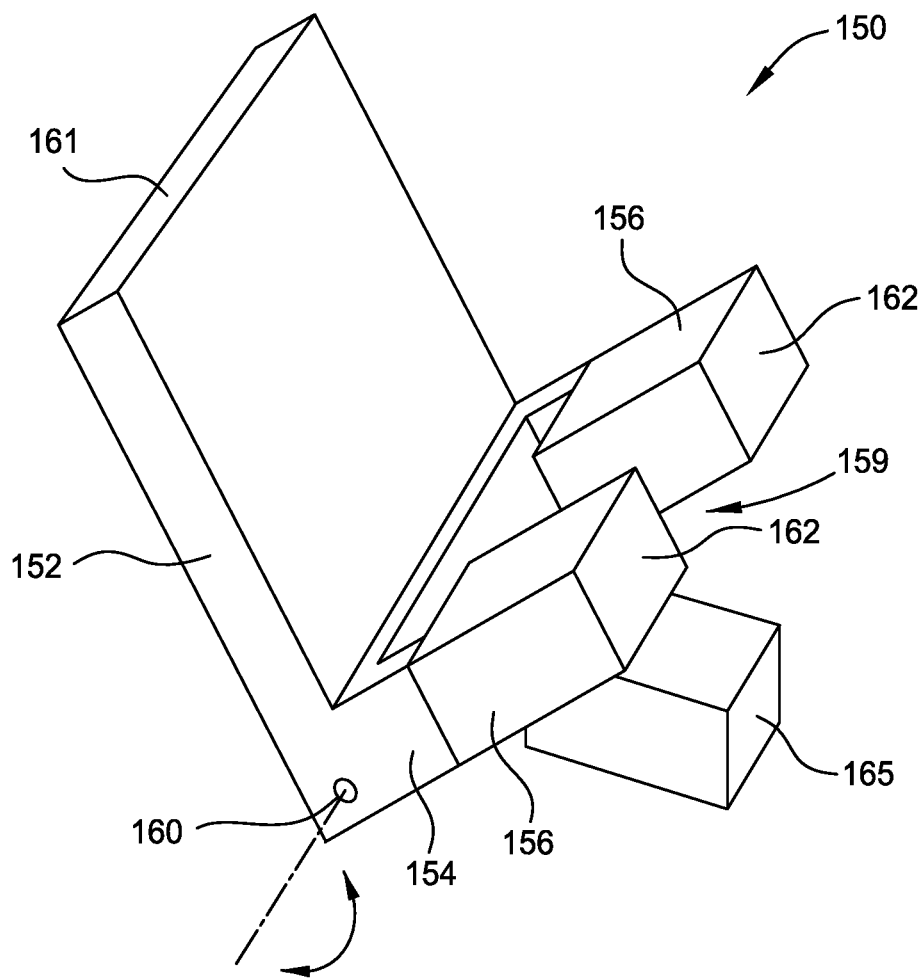
FIG. 5A shows a perspective view of the magnetically-operated latch mechanism in the open position or "unlatched" position, according to an embodiment.
Figure 5B:
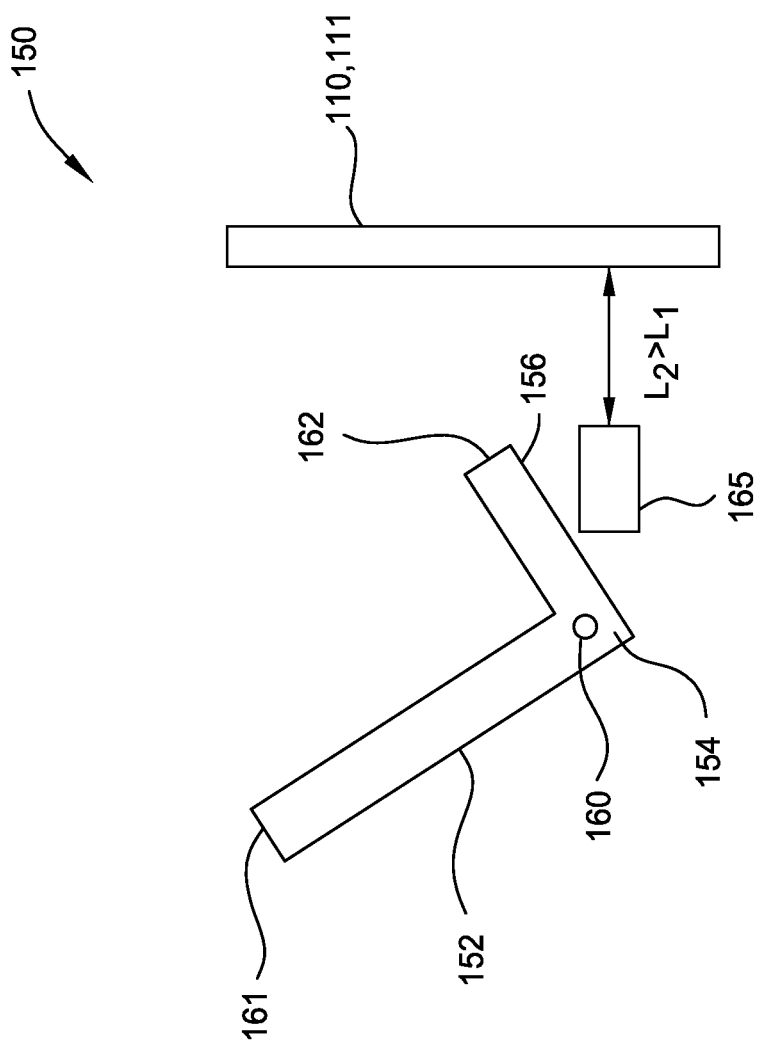
FIG. 5B is a side view of the magnetically-operated latch mechanism in the open position, according to an embodiment.

FIG. 5A shows a perspective view of the magnetically-operated latch mechanism 150 in the open position or "unlatched" position employing the actuating mechanism 142 in the form of a lever/tongue 119. FIG. 5B is a side view of the magnetically-operated latch mechanism 150 in the open position. Referring now to FIGS. 4A, 5A and 5B, when an actuating mechanism 142 in the form of a lever is pulled, the latch mechanism 150 rotates counter-clockwise to the "open" or unlatched" position. Operating the actuating mechanism 142 causes an end 161 of the upper member 152 to rotate the latch mechanism 150 about the pin 160 such that the upper member 152 is pulled horizontally away at an angle from the post 110, 111 and the extensions 156 and the plates 162 are pulled vertically away from permanent magnet 165 and the post 110, 111 by the same angle. When the plates 162 actuate upward (out of the page) when the actuating mechanism 142 is pulled, the plates 162 slide free under a frictional force from the permanent magnet 165. Accordingly, the extensions 156 and magnetically-attracted plates 162 become unaligned with and are in a furthest position from the permanent magnet 165 and the post 110, 111 to produce a minimum amount of magnetic attraction between the permanent magnet 165 and the posts 110, 111, thereby placing the latch mechanism 150 in the "open" or "unlatched" position. In the open or unlatched position, the permanent magnet 165 is separated by a second distance $L_2$ greater than the first distance $L_1$ from the post 110, 111. The pull force required to separate the permanent magnet 165 from the plates 162/post 110, 111 is significantly reduced. For example, the magnetic force between the permanent magnet 165 and the plates 162/post 110, 111 may be reduced by an order of magnitude.

In this "open" configuration, the magnetic force between the permanent magnet 165 and the plates 162/post 110, 111 is so reduced to permit the server 120 to be pulled out of the rack system 100. In one embodiment, after removal of the server 120, the latch mechanism 150 reverts back to the closed position because a center of gravity of the latch mechanism 150 is located closer to the extensions 156 due to the weight of the plates 162 and the residual magnetic attraction of the permanent magnet 165 to the plates 162.

Although the embodiment of FIGS. 4A-5B show the plates 162 affixed to the extensions 156 of the lower member 154 of the latch mechanism 150 and the permanent magnet 165 affixed to the post 110, 111 between the extensions 156 and the plates 162, other embodiments contemplate the reversal of the role of the plates 162 and the permanent magnet 165. The latch mechanism 150 would work equally well if a pair of permanent magnets were affixed to the lower members 154 of the latch mechanism 150 with a magnetically-attractive plate affixed to the post 110, 111 between the extensions 156.

Figure 6A:
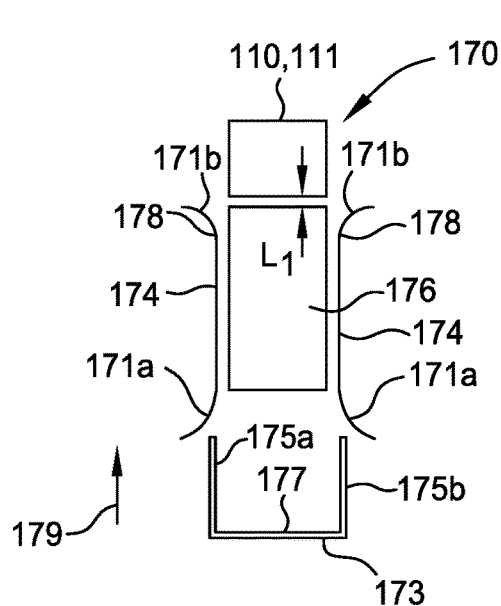
FIG. 6A shows a latch mechanism which is activated from a latched or closed position to an unlatched or open position by a push button, according to an embodiment.
Figure 6B:
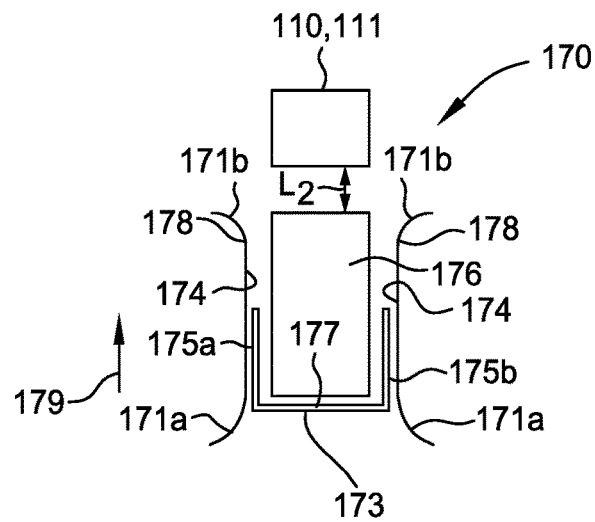
FIG. 6B shows a latch mechanism which is activated by a push button, according to an embodiment.

FIGS. 6A-6D show two versions of a magnetically-operated latch mechanism 170, 172 employing the actuating mechanism 142 in the form of a push button 173, 182 according to an embodiment. FIG. 6A shows the latch mechanism 170 in a "closed" or "latched" configuration, while FIG. 6B shows the latch mechanism 170 in an "open" or "unlatched" configuration. The latch mechanism 170 includes a pair of plates 178 having near ends 171a and shorter far ends 171b curved outward away from the orientation of the plates 178. In another embodiment, the far ends 171b are not curved (e.g., aligned with a central section/portion 177). The latch mechanism 170 also includes a permanent magnet 176, and a push button 173. The outwardly-curved near ends 171a are disposed proximal to the push button 173. The plates 178 are made of a ferro-magnetic material (e.g., steel) and are thus attracted to the permanent magnet 176. The permanent magnet 176 may be elongated and cylindrical or rectangular in shape. Elongated central portions of 174 of the plates 178 are separated by a first distance by the permanent magnet 176 equal to about the width of the permanent magnet 176. The push button 173 has two end portions 175a, 175b aligned with the orientation of the plates 178 and joined by the horizontal central portion 177. The central portion 177 has a width that is larger than the first distance separating the plates 178 in the "closed position."

The push button 173 is not engaged with the plates 178 when the latch mechanism 170 is in the closed position. Accordingly, the magnetic attraction between the plates 178 and the permanent magnet 176 is at a maximum to retain the plates 178 in close proximity to the permanent magnet 176. The magnetic force of attraction between the permanent magnet 176 and the external post 110, 111 is also at a maximum. Accordingly, the distance between the permanent magnet 176 and the post 110, 111 is at a minimum distance $L_1$.

When a user pushes the push button 173 toward the plates 178 in a direction indicated by the arrow 179, the near ends 171a of the disengagement mechanism 173 engage the inner sides of the plates 178. The force of the push on the disengagement mechanism 173 and the outward curvature of near ends 171a of the plates 178 cause the plates 178 to separate to a second distance greater than the first distance away from the permanent magnet 176 in FIG. 6B at least as wide as the width of the horizontal central portion 174 of the push button 173. The greater separation of the plates 178 from the permanent magnet 176 decreases the magnetic attraction between the permanent magnet 176 and the posts 110, 111. The permanent magnet 176 may now be separated by a distance $L_2 > L_1$ from the external posts 110, 111 as a result of the weaker magnetic force of attraction between components. Accordingly, the latch mechanism 170 is now in the open position to permit easy removal of the server 120 from the rack system 100 due to lower magnetic attraction of the components to each other in the latch mechanism 172.

Figure 6C:
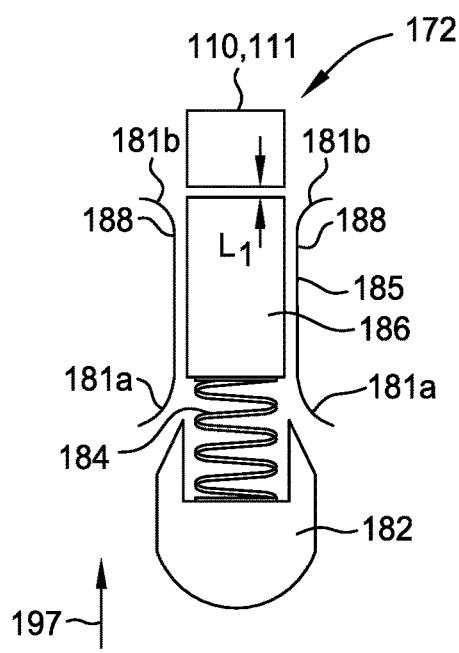
FIG. 6C shows a latch mechanism which is activated by a push button and a spring "closed" or "latched" configuration.
Figure 6D:
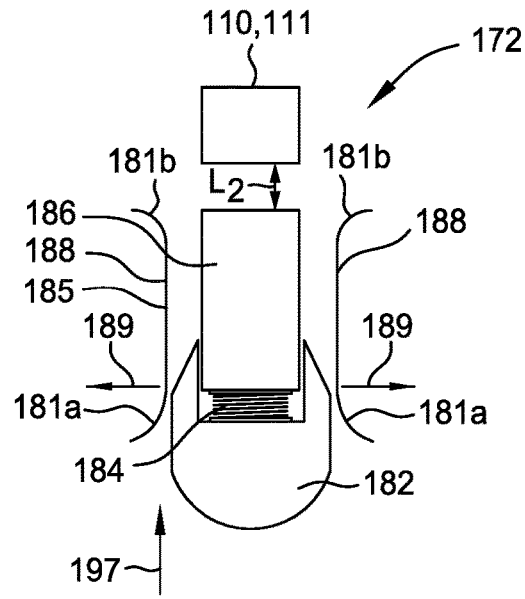
FIG. 6D shows the latch mechanism of FIG. 6C in an "open" or "unlatched" configuration.

FIGS. 6C and 6D shows the latch mechanism 172 which is activated by a push button 182 and a spring 184. FIG. 6C shows the latch mechanism 172 in a "closed" or "latched" configuration, while FIG. 6D shows the latch mechanism 172 in an "open" or "unlatched" configuration. The latch mechanism 172 includes a pair of plates 188 having near ends 181a and far ends 181b curved outward away from the orientation of the plates 188. In another embodiment, the far ends 181b are not curved (e.g., aligned with a central section/portion 185). The outwardly-curved near ends 181a are disposed proximal to the push button 182. The latch mechanism 172 also includes a permanent magnet 186, the push button 182, and the spring 184. The plates 188 are made of a ferro-magnetic material (e.g., steel) and are thus attracted to the permanent magnet 186. The permanent magnet 186 may be elongated and cylindrical or rectangular in shape. In the "closed" or "latched" configuration, a substantially straight center portion 184 of the plates 188 are separated by a first distance by the permanent magnet 186 equal to about the width of the permanent magnet 186.

The push button 182 is affixed to the spring 184 in contact with a near end of the permanent magnet 186. The push button 182 has a width that is larger than the first distance or width of the permanent magnet. Since the spring is not contracted, there is no force pushing the permanent magnet 186. The latch mechanism 172 is thus shown in FIG. 6C in the "closed" position. The magnetic force of attraction between the permanent magnet 186 and the external post 110, 111 is at a maximum. Accordingly, the distance between the permanent magnet 186 and the external post 110, 111 is at a minimum distance $L_1$.

When a user pushes the button 182, the force of the push on the spring 184 causes the spring to contract toward the permanent magnet 186. The stored potential energy of the contracted spring causes the permanent magnet 186 to move toward far ends 181b of the plates 188. The push button 182 eventually comes in contact with the near ends 182a of the plates 188 and pushes the near ends 181a of the plates 188 because of the outward curvature of the plates 188 and the width of the push button 182. The plates 188 separate to at least a second distance greater than the first distance away from the permanent magnet 186 in FIG. 6D at least as wide as the width of the push button 182. The greater separation of the plates 188 from the permanent magnet 186 decreases the magnetic attraction between the permanent magnet 186 and the external post 110, 111. The magnetic force of attraction between the permanent magnet 186 and the external post 110, 111 is also at a minimum. Accordingly, the distance between the permanent magnet 186 and the external post 110, 111 is at a maximum distance $L_2 > L_1$ as a result of the weaker magnetic force of attraction between components. Accordingly, the latch mechanism 172 is now in the open position to permit easy removal of the server 120 from the rack system 100 due to lower magnetic attraction of the components to each other in the latch mechanism 172.

After removal of the server 120, the latch mechanism 170, 172 reverts back to the closed position because the plates 178, 188 are residually magnetically attracted to the permanent magnet 176, 186 or because the sidewalls are made of an elastically deformable material to automatically revert back to the closed or latched position.

Although the embodiment of FIGS. 6A-6D show the separable plates 178, 188 are metallic temporary magnets with a permanent magnet 176, 186 therebetween, in another embodiment, the latch mechanisms 172, 174 would work equally well with plates 178, 188 made from permanent magnets and a magnetically attractive metal plates 178, 188 to separate the plates 178, 188.

FIGS. 7A and 7B show a screw activated magnetically-operated latch mechanism 190, employing the actuating mechanism 142 in the form of a screw 200 according to an embodiment. The latch mechanism 190 is shown in a "closed" position or "latched" position in FIG. 7A, and an "open" position or "unlatched" position in FIG. 7B. The latch mechanism 190 includes the screw 200, a permanent magnet 196 contacting the screw 200, and a magnetically attractive plate 198. The magnetically attractive plate 198 may be cylindrical or rectangular in shape have two parallel end sections 204 aligned with and abutting the corresponding parallel sides 206 of the permanent magnet 196, and further a central section 208 perpendicular to and connecting the end sections 204 that engage a third side 283 of the permanent magnet 196. The third side 283 of the plate 198 is made in part of a ferromagnetic potting material 202. The third side 283 of the plate 198 containing the potting material 202 has a threaded aperture 212 to receive a non-magnetic screw 200.

In the closed position of FIG. 7A, the permanent magnet 196 is surrounded on three sides by the plate 198 including the two parallel end sections 204 and the third side 210. The two parallel end sections 204 of the plate 198 align with an external post 110, 111. The external post 110, 111 includes a non-magnetic rectangular rail plate 192 engaging a rectangular magnetic rail plate 194 and the permanent magnet 196. The external post 110, 111 is separated from the latch mechanism 190 by a first distance (not shown and equal to 0) such that the magnetic force of attraction between the plate 198, the permanent magnet 196, and the rectangular magnetic rail plate 194 of the external post 110, 111 is at a maximum.

The plate 198 and the permanent magnet 196 are initially separated by a first distance in a closed position When the screw 200 is rotated clockwise in the aperture 212, the screw 200 turns in such a way as to push the two parallel end sections 204 of the magnetically attractive plate 198 and the permanent magnet 196 from a first distance from the external post 110, 111 (e.g., distance equals 0) to the second distance (distance greater than 0) greater than the first distance, thereby reducing the magnetic attraction between the permanent magnet 196 and the external post 110, 111. The latch mechanism 190 is now in the "open" position as shown by the arrow 197 in FIG. 7B. Accordingly, the latch mechanism 190 in the open position to permit easy removal of the server 120 from the rack system 100 due to lower magnetic attraction of the components to each other in the latch mechanism 190.

In one embodiment, the number of turns of the non-magnetic screw 200 needed to engage or disengage the permanent magnet 196 to move the latch mechanism 190 between positions is typically a quarter-turn or half-turn. In embodiments, the non-magnetic screw 200 needs to have a reasonable thread pitch to allow rapid engagement/disengagement with minimal turning.

Although the embodiment of FIGS. 7A and 7B show that the plate 198 made in part of a ferromagnetic potting material 202 is a metallic temporary magnets having a permanent magnet 196 therebetween, in another embodiment, the latch mechanism 190 would work equally well with plate 198 made out of a permanent magnet and a module of magnetically-attractive ferromagnetic potting material 202 in place of the permanent magnet 196.

After removal of the server 120, the user may turn the non-magnetic screw counter-clockwise to push the plate 198 and the permanent magnet 196 towards the post 110, 111 to the "closed" position as indicated by the arrow 197 in FIG. 7B.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In the following, reference is made to embodiments presented in this disclosure. However, the scope of the present disclosure is not limited to specific described embodiments. Instead, any combination of the following features and elements, whether related to different embodiments or not, is contemplated to implement and practice contemplated embodiments. Furthermore, although embodiments disclosed herein may achieve advantages over other possible solutions or over the prior art, whether or not a particular advantage is achieved by a given embodiment is not limiting of the scope of the present disclosure. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

While the foregoing is directed to embodiments of the present invention, other and further embodiments of the invention may be devised without departing from the basic scope thereof, and the scope thereof is determined by the claims that follow.

What is claimed is:

1. A slam latch for mounting and unmounting a computing system in a rack computing system, comprising:
 a permanent magnet;
 at least one magnetically attractive plate separated by a first distance from the permanent magnet, wherein the permanent magnet has a first magnetic force of attraction to an external post, wherein the permanent magnet has a second magnetic force of attraction to the external post lower than the first force of attraction when the at least one plate is forceably separated from the permanent magnet by a second distance that is greater than the first distance;
 an elongated upper member; and
 a lower member intersecting the upper member at an intersection, the lower member including a first extension separated from a second extension such that there is a space between the first extension and the second extension for receiving the permanent magnet therebetween and corresponding to the first distance or the second distance.

2. The slam latch of claim 1, wherein
 the at least one plate comprises a pair of magnetically-attractive plates associated with respective ones of the extensions.

3. The slam latch of claim 1, further comprising:
 a pin threading the upper member and the lower member at the intersection.

4. The slam latch of claim 3, wherein the upper member and the lower member are configured to rotate about the pin such that the pair of plates are separated from the permanent magnet by the second distance when a force is applied to the upper member.

5. The slam latch of claim 3, wherein the upper member and the pair of plates are configured to rotate about the pin such that the pair of plates are separated from the permanent magnet by the second distance when a force is removed from the upper member.

6. The slam latch of claim 3, wherein the upper member and the lower member are made of a non-ferro-magnetic material.

7. The slam latch of claim 3, further comprising a lever configured to rotate the upper member.

8. The slam latch of claim 1, further comprising:
a push button proximal to the permanent magnet,
wherein the at least one plate comprises a pair of magnetically attracted elongated plates having outwardly-curved ends proximal to the push button, wherein when the push button is not activated, the pair of elongated plates are separated by the first distance corresponding to the width of the permanent magnet.

9. The slam latch of claim 8, wherein, when the push button is activated, a force is applied by the push button to the outwardly-curved ends proximal to the push button to separate the elongated plates to a second distance greater than the first distance.

10. The slam latch of claim 8, further comprising: a spring engaging the push button and the permanent magnet,
wherein, when the push button is pushed,
the force of the push on the spring and the outwardly-curved ends proximal to the push button causes the permanent magnet to move in a forward direction to separate the pair of elongated plates from the first distance to the second distance.

11. The slam latch of claim 1, further comprising:
a screw; and
the permanent magnet contacting the screw,
wherein the at least one magnetically attractive plate comprises two parallel end sections aligned with and abutting the corresponding parallel sides of the permanent magnet, and a central section perpendicular to and connecting the end sections that engage a third side of the permanent magnet, and
wherein the central section has a threaded aperture threaded to receive the screw.

12. The slam latch of claim 11, wherein the screw is configured to be rotated in the aperture to push the two parallel end sections of the at least one magnetically attractive plate and the permanent magnet from the first distance to the second distance, thereby reducing the magnetic attraction between the permanent magnet and the external post.

13. A system, comprising:
a computing system;
a rack comprising at least one rail; and
a slam latch system located in a housing for sliding the computing system away from the rail, the slam latch system comprising:
a permanent magnet;
at least one magnetically attractive plate separated by a first distance from the permanent magnet, wherein the permanent magnet has a first magnetic force of attraction to an external post, wherein the permanent magnet has a second magnetic force of attraction to the external post lower than the first force of attraction when the at least one plate is forceably separated from the permanent magnet by a second distance that is greater than the first distance;
an elongated upper member; and
a lower member intersecting the upper member at an intersection, the lower member including a first extension separated from a second extension such that there is a space between the first extension and the second extension for receiving the permanent magnet therebetween and corresponding to the first distance or the second distance.

14. The computing system of claim 13, wherein the
at least one plate comprises a pair of magnetically-attractive plates associated with respective ones of the extensions.

15. The computing system of claim 13, wherein the upper member and the pair of plates are configured to rotate about the pin such that the pair of plates are separated from the permanent magnet by the second distance when a force is removed from the upper member.

16. The computing system of claim 13, wherein the slam latch system further comprises:
a push button proximal to the permanent magnet,
wherein the at least one plate comprises a pair of magnetically attracted elongated plates having outwardly-curved ends proximal to the push button, wherein when the push button is not activated, the pair of elongated plates are separated by the first distance corresponding to the width of the permanent magnet.

17. The computing system of claim 16, wherein, when the push button is activated, a force is applied by the push button to the outwardly-curved ends proximal to the push button to separate the elongated plates to a second distance greater than the first distance.

18. The computing system of claim 13, wherein the slam latch system further comprises:
a screw; and
the permanent magnet contacting the screw,
wherein the at least one magnetically attractive plate comprises two parallel end sections aligned with and abutting the corresponding parallel sides of the permanent magnet, and a central section perpendicular to and connecting the end sections that engage a third side of the permanent magnet, and
wherein the central section has a threaded aperture threaded to receive the screw.

* * * * *